(12) United States Patent
Savill, Jr. et al.

(10) Patent No.: US 9,142,390 B2
(45) Date of Patent: Sep. 22, 2015

(54) CATHODE INTERFACE FOR A PLASMA GUN AND METHOD OF MAKING AND USING THE SAME

(71) Applicant: SULZER METCO (US) Inc., Westbury, NY (US)

(72) Inventors: Robert F. Savill, Jr., Levittown, NY (US); Ronald J. Molz, Ossining, NY (US); Dave Hawley, Westbury, NY (US)

(73) Assignee: OERLIKON METCO (US) INC., Westbury, NY (US)

( * ) Notice: Subject to any disclaimer, the term of this patent is extended or adjusted under 35 U.S.C. 154(b) by 0 days.

(21) Appl. No.: 14/128,265

(22) PCT Filed: May 7, 2013

(86) PCT No.: PCT/US2013/039847
§ 371 (c)(1),
(2) Date: Dec. 20, 2013

(87) PCT Pub. No.: WO2013/169710
PCT Pub. Date: Nov. 14, 2013

(65) Prior Publication Data
US 2014/0167597 A1 Jun. 19, 2014

Related U.S. Application Data

(60) Provisional application No. 61/645,272, filed on May 10, 2012.

(51) Int. Cl.
*H01J 37/32* (2006.01)
*H01J 9/18* (2006.01)
*H05H 1/34* (2006.01)
*H05H 1/42* (2006.01)

(52) U.S. Cl.
CPC ............. *H01J 37/32605* (2013.01); *H01J 9/18* (2013.01); *H05H 1/34* (2013.01); *H05H 1/42* (2013.01); *H05H 2001/3452* (2013.01)

(58) Field of Classification Search
None
See application file for complete search history.

(56) References Cited

U.S. PATENT DOCUMENTS

| 4,688,722 | A  | * | 8/1987  | Dellassio et al. ............... 239/81 |
| 5,298,835 | A  |   | 3/1994  | Muehlberger et al. |
| 7,759,599 | B2 |   | 7/2010  | Hawley et al. |
| 2002/0144982 | A1 |   | 10/2002 | Chancey et al. |

FOREIGN PATENT DOCUMENTS

EP 0 375 931 7/1990

OTHER PUBLICATIONS

PCT Search Report issued in PCT application No. PCT/US2013/039847 mailed on Sep. 6, 2013.
PCT IPER issued in PCT application No. PCT/US2013/039847 mailed on Nov. 20, 2014 (10 pages).

* cited by examiner

*Primary Examiner* — Ashok Patel
(74) *Attorney, Agent, or Firm* — Greenblum & Bernstein, P.L.C.

(57) ABSTRACT

Interchangeable or standard electrode interface for a thermal spray plasma gun includes an interchangeable electrode having a first connecting section and a first annular coupling surface. A second connecting section is arranged in a plasma gun and includes a second annular coupling surface. An annular seal is spaced or axially spaced from an annular interface formed between the first and second annular coupling surfaces.

21 Claims, 12 Drawing Sheets

CATHODE INTERFACE FOR A PLASMA GUN AND METHOD OF MAKING AND USING THE SAME

CROSS-REFERENCE TO RELATED APPLICATIONS

The instant application is a U.S. National Stage of International PCT Application No. PCT/US2013/039847 filed May 7, 2013 which published as WO 2013/169710 on Nov. 14, 2013 and claims the benefit of U.S. provisional application No. 61/645,272 filed on May 10, 2012, the disclosures of which are hereby expressly incorporated by reference in their entireties.

STATEMENT REGARDING FEDERALLY SPONSORED RESEARCH OR DEVELOPMENT

Not applicable.

REFERENCE TO A COMPACT DISK APPENDIX

Not applicable.

BACKGROUND OF THE INVENTION

1. Field of the Invention

The present invention relates generally to equipment for the thermal spraying of powdered materials. More specifically, the present invention relates to a cathode interface for use with a thermal spray plasma gun.

2. Description of Related Art

A variety of thermal spray coatings have been used to protect various types of components. Coatings may provide various benefits such as to resist wear, retard corrosion, control clearances, salvage worn components, resist high temperatures and/or enhance electrical properties. These benefits can differ based on the coating material type and how those materials are applied. One group of spray coatings to which the subject matter of the present invention pertains in particular are those applied via the plasma spray process. This process has been used to apply many different types of coatings in numerous industries.

Each material coating specification requires a specific range of velocity and temperature transferred to the powder particle to achieve the required material properties on the part Improved consistency and efficiency in the delivery of thermal spray coatings remains an industry-wide goal.

The plasma gun has been used as a process tool in the spray coatings industry due to the wide range of parameters that are achievable with this basic tool. A key element of any plasma gun is the cathode geometry. Variations in cathode geometry can allow a plasma gun to provide coating properties at a different temperatures and velocities from the same base equipment. During repeat use, cathode exhibit wear which leads to replacement of the part. Thus a single plasma gun typically required replacement of the cathode. Prior art configurations were such that replacement of the cathode was difficult and took a long time, leading to long down times when the part needed to be replaced.

However, there are a number of factors that can prove challenging in replacing the a plasma gun cathode. Plasma spray guns must perform several different functions in order to achieve a successful coating process. Those functions include proper alignment of the cathode as well as cooling of the gun cathode during the spray process to prevent overheating. Accordingly proper flow of coolant sealing around the cathode area and adequate sealing of the cooling path is needed. An electrical connection between the cathode and the plasma gun is also required to serve as the return path for the plasma arc current flow. Precise orientation of mechanical location, electrical connections and water chamber seals must be achieved to obtain the desired gun operation and gun characteristics.

FIGS. 1 and 2 show one example of a known plasma gun 1 (only the certain main portions of the gun are shown for purposes of illustration) that has a replaceable cathode 10. As can be readily seen, the cathode 10 has a mounting portion 20 and a tip 30 from whose front end 32 a plasma arc discharges in a continuous manner during plasma spraying. The tip 30 typically has a rear portion 31 that is fixed to and extends into a receiving zone 24 of the mounting portion 20. The mounting portion 20 includes a main internal space 21 which is sized and configured to receive therein cooling fluid and accommodates therein a front portion of a cooling tube 40. Cooling fluid passes through the tube 40 via a main cooling passage 70 of the plasma gun 1. The mounting portion 20 also includes an external thread 22 which threads into comparable internal threads of the component 50 and functions to axially mechanically fix and electrically connect the cathode 10 to a main internal component 50 of the plasma gun 1. However, to provide sealing between the cathode 10 and the component 50 to among other things, prevent cooling fluid (typically pressurized) from escaping from the space 21, a seal or O-ring 60 is typically provided in an area of an annular connecting interface 23. Owing to its position in the interface 23, the O-ring 60 is subjected to relatively high temperatures. Additionally, its location in the interface 23 is not ideal from the standpoint of providing maximum electrical conductivity between the cathode 10 and the component 50. As such, providing a standardized interface which would offer significant improvement over known connecting interfaces between these components should take these considerations into account.

Utilizing a standard interface in a plasma gun has been utilized in areas such as the nozzle interface. U.S. Pat. No. 7,759,599 to HAWLEY et al., for example, describes one such arrangement, the disclosure of which is hereby expressly incorporated by reference thereto in its entirety. However, providing a standard interface for a cathode of a plasma gun has unique challenges which are not addressed by this document.

A standard interface for each cathode that would assure proper orientation of all plasma gun components with each interchangeable cathode, while minimizing the risk of human error would be beneficial to the spray coating industry. Optimal orientation could extend the range of performance for a single thermal spray plasma gun. Thus, there remains a need in the art for a standard cathode interface for a thermal spray plasma gun that provides an optimal, efficient and repeatable cathode connection for a wide range of cathode geometries.

SUMMARY OF THE INVENTION

The present invention provides a standard interface that takes into account one or more of the noted deficiencies and provides an interface that is better or improved from a mechanical location and orientation standpoint, provides for an improved electrical connection, and also improves sealing integrity and life. Such an arrangement can be used for a variety of plasma forming electrodes. The flexibility of the connecting interface is believed to offer a marked improvement over known designs.

The interface arrangement in accordance with the invention can ideally serve as a common mechanical interface for mating an interchangeable cathode to a thermal spray plasma gun body. In the assembled configuration, water flow may be carried between the gun body, through the cathode, and back out to a return water flow channel. Also, the interface provides sufficient capability to passing an electrical current of up to about 800 amps at up to about 300 volts between gun body (or components thereof) and the cathode. The actual power through the interface will, of course, vary depending upon the specific materials to be sprayed with the gun and the desired coating characteristics.

According to one non-limiting embodiment of the invention, there is provided an interchangeable or standard electrode interface for a thermal spray plasma gun, comprising an interchangeable electrode comprising a first connecting section and a first annular coupling surface, a second connecting section arranged in a plasma gun and comprising a second annular coupling surface, and an annular seal axially spaced from an annular interface formed between the first and second annular coupling surfaces. The annular seal can be at least one of axially spaced from an annular interface, located outside of an annular interface and/or can provide sealing in a sealing zone separated from an annular interface.

In embodiments, the interchangeable electrode is a cathode electrode.

In embodiments, the interchangeable electrode comprises a mounting portion and a different material arc discharge portion.

In embodiments, the first connecting section comprises an external thread and the second connecting section comprises an internal thread.

In embodiments, in an installed condition, the first and second annular coupling surfaces electrically and mechanically contact one another and/or the first and second annular coupling surfaces electrically and mechanically contact one another and form a main electrical interface without any non-metallic or non-electrically conductive seal interposed therein.

In embodiments, the annular seal is an O-ring.

In embodiments, the annular seal is arranged in an outer circumferential groove of the interchangeable electrode.

In embodiments, the annular seal is located axially in front of the first and second annular coupling surfaces.

In embodiments, the annular seal is arranged to provide sealing between inner and outer circumferential surfaces.

In embodiments, the second connecting section is arranged at least one of on a main internal component of the plasma gun and on a non-interchangeable internal component of the plasma gun.

In embodiments, the interchangeable electrode is a cathode electrode having an internal cooling space.

The invention also provides for an interchangeable or standard electrode interface for a thermal spray plasma gun, comprising an interchangeable electrode comprising a first connecting section and a first annular coupling surface and a second connecting section arranged in a plasma gun and comprising a second annular coupling surface. The first and second annular coupling surfaces are arranged generally perpendicular to a center longitudinal axis of the interchangeable electrode. An annular seal is arranged in a circumferential groove and being axially spaced from an annular interface formed between the first and second annular coupling surfaces.

In embodiments, the interchangeable electrode is a cathode electrode.

In embodiments, the interchangeable electrode comprises a mounting portion and a different material arc discharge portion.

In embodiments, the first connecting section comprises an external thread and the second connecting section comprises an internal thread.

In embodiments, in an installed condition, the first and second annular coupling surfaces electrically and mechanically contact one another.

In embodiments, the annular seal is an O-ring.

In embodiments, the circumferential groove is an outer circumferential groove arranged on the interchangeable electrode.

In embodiments, the annular seal is located axially in front of the first and second annular coupling surfaces.

In embodiments, the annular seal is arranged to provide sealing between inner and outer circumferential surfaces.

In embodiments, the second connecting section is arranged at least one of an a main internal component of the plasma gun and on a non-interchangeable internal component of the plasma gun.

In embodiments, the interchangeable electrode is a cathode electrode having an internal cooling space.

The invention also provides for an interchangeable or standard cathode electrode interface for a thermal spray plasma gun, comprising an interchangeable cathode comprising a first connecting section and a first annular coupling surface. a second connecting section arranged in a plasma gun and comprising a second annular coupling surface and an annular seal arranged in a circumferential groove and being axially spaced from an annular interface formed between the first and second annular coupling surfaces.

In embodiments, the interchangeable cathode comprises a mounting portion and a different material arc discharge portion.

In embodiments, the first connecting section comprises an external thread and the second connecting section comprises an internal thread.

In embodiments, in an installed condition, the first and second annular coupling surfaces electrically and mechanically contact one another.

In embodiments, the annular seal is an O-ring.

In embodiments, the circumferential groove is an outer circumferential groove arranged on the interchangeable cathode.

In embodiments, the annular seal is located axially in front of the first and second annular coupling surfaces and the first and second annular coupling surfaces are arranged generally perpendicular to a center longitudinal axis of the interchangeable cathode.

In embodiments, the annular seal is arranged to provide sealing between inner and outer circumferential surfaces.

In embodiments, the second connecting section is arranged at least one of on a main internal component of the plasma gun and on a non-interchangeable internal component of the plasma gun.

The invention also provides for a method of making a plasma gun comprising installing, in the plasma gun, an interchangeable electrode having the interchangeable interface in accordance with anyone of the above-noted embodiments.

The invention also provides for a method of replacing an interchangeable electrode of a plasma gun comprising removing a used interchangeable electrode from the plasma gun and installing a new interchangeable electrode having the interchangeable interface in accordance with anyone of the above-noted embodiments.

Additional features of the invention will be set forth in the figures and any description which follows, and in part will be obvious from the description, or may be learned by practice of the invention. The features of the invention may be realized and obtained by way of the features, instrumentalities and/or feature combinations particularly pointed out hereinafter.

BRIEF DESCRIPTION OF THE DRAWINGS

The present invention is further described in the detailed description which follows, in reference to the noted drawings by way of a non-limiting example embodiment of the present invention, and wherein.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
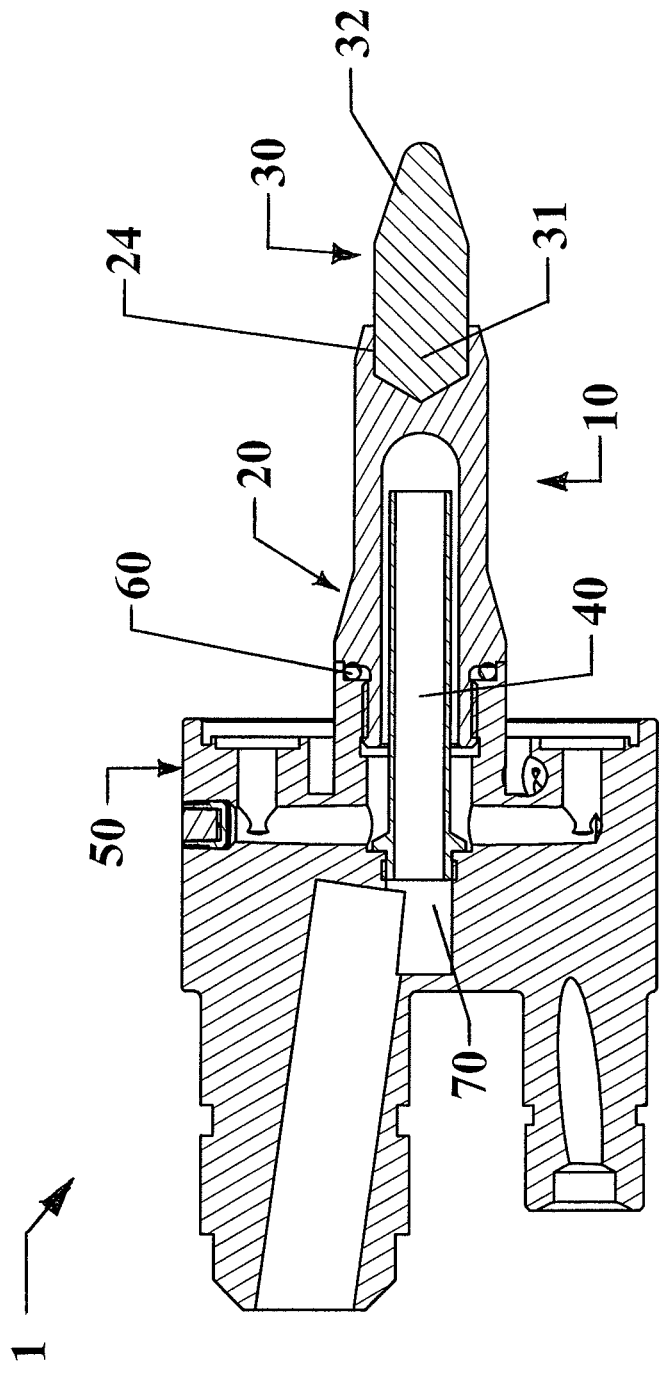
FIG. 1 shows a cross-section view of an internal section of a prior art plasma gun.
Figure 2:
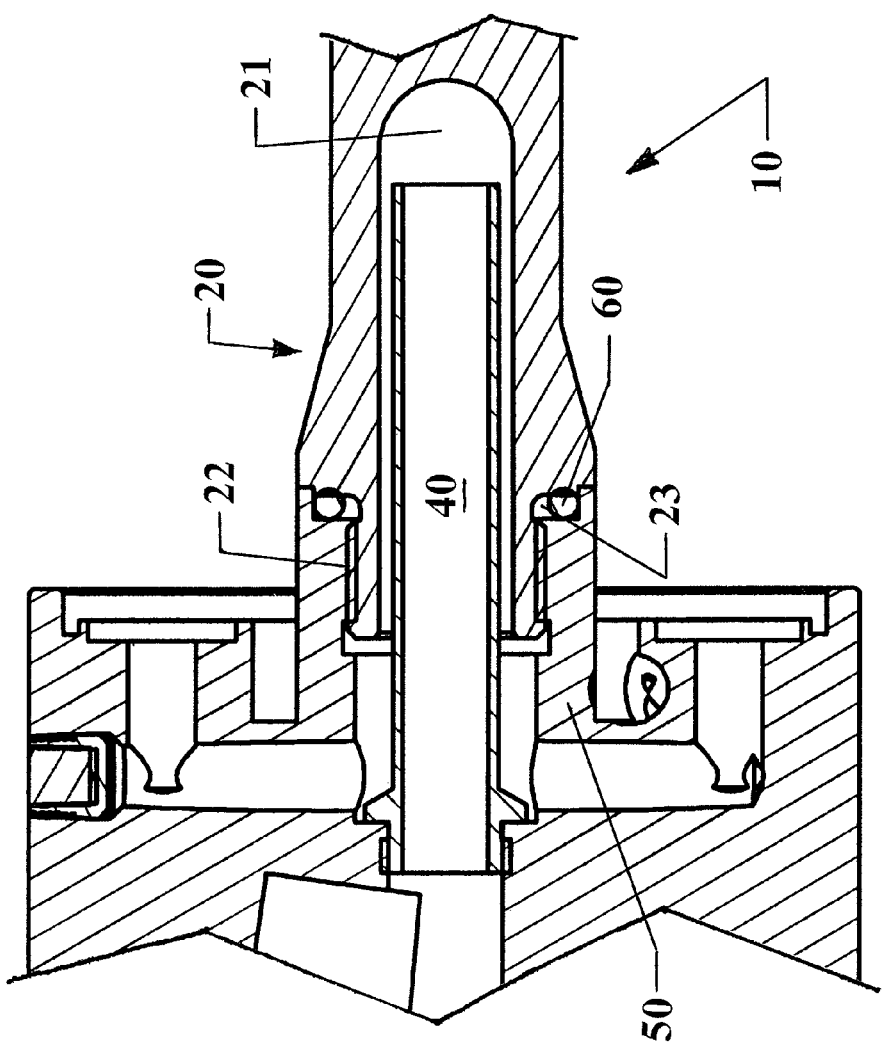
FIG. 2 shows an enlarged portion of FIG. 1.
Figure 3:
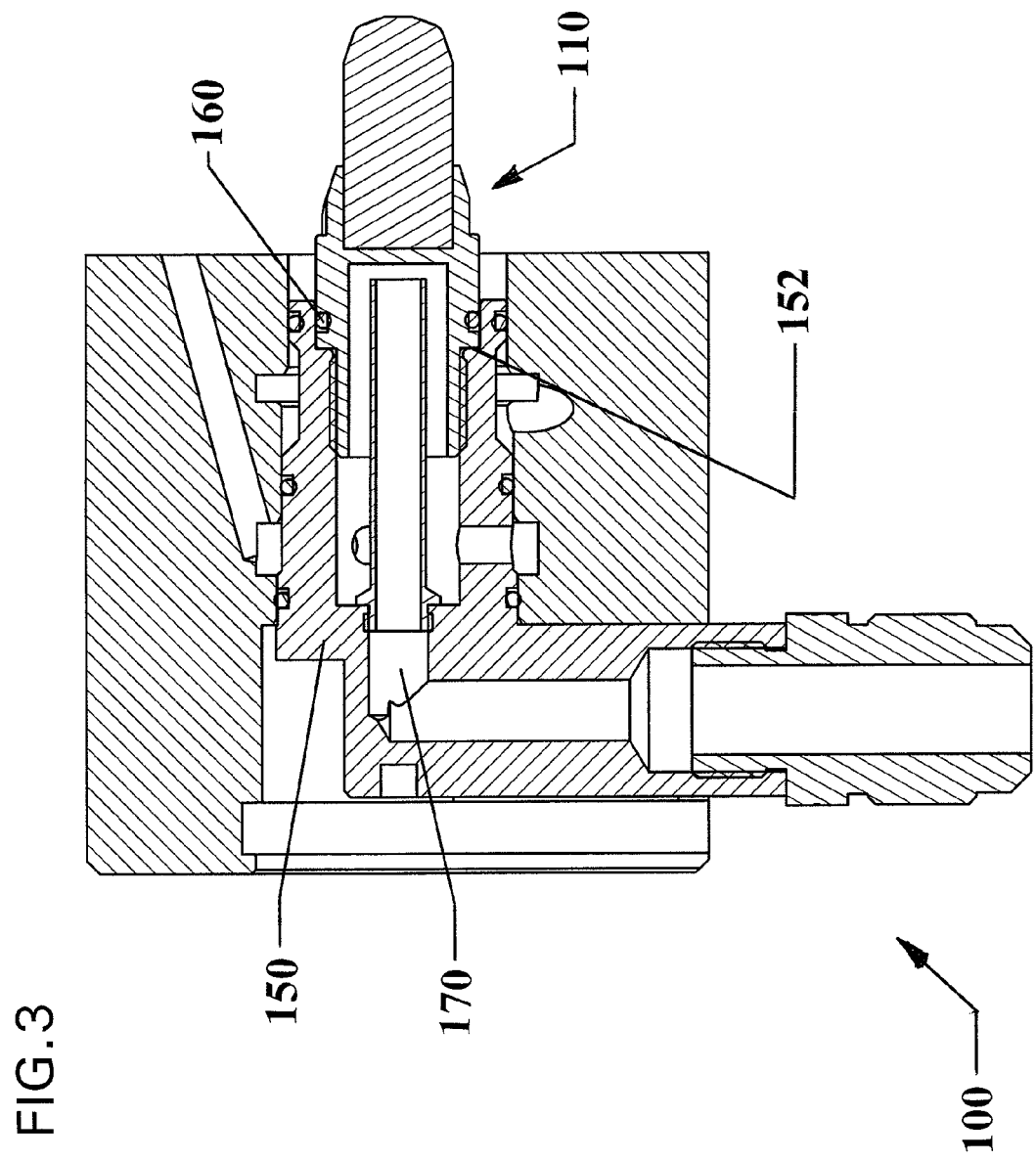
FIG. 3 shows a cross-section view of an internal section of a plasma gun utilizing an interchangeable electrode interface in accordance with one non-limiting embodiment of the invention.
Figure 4:
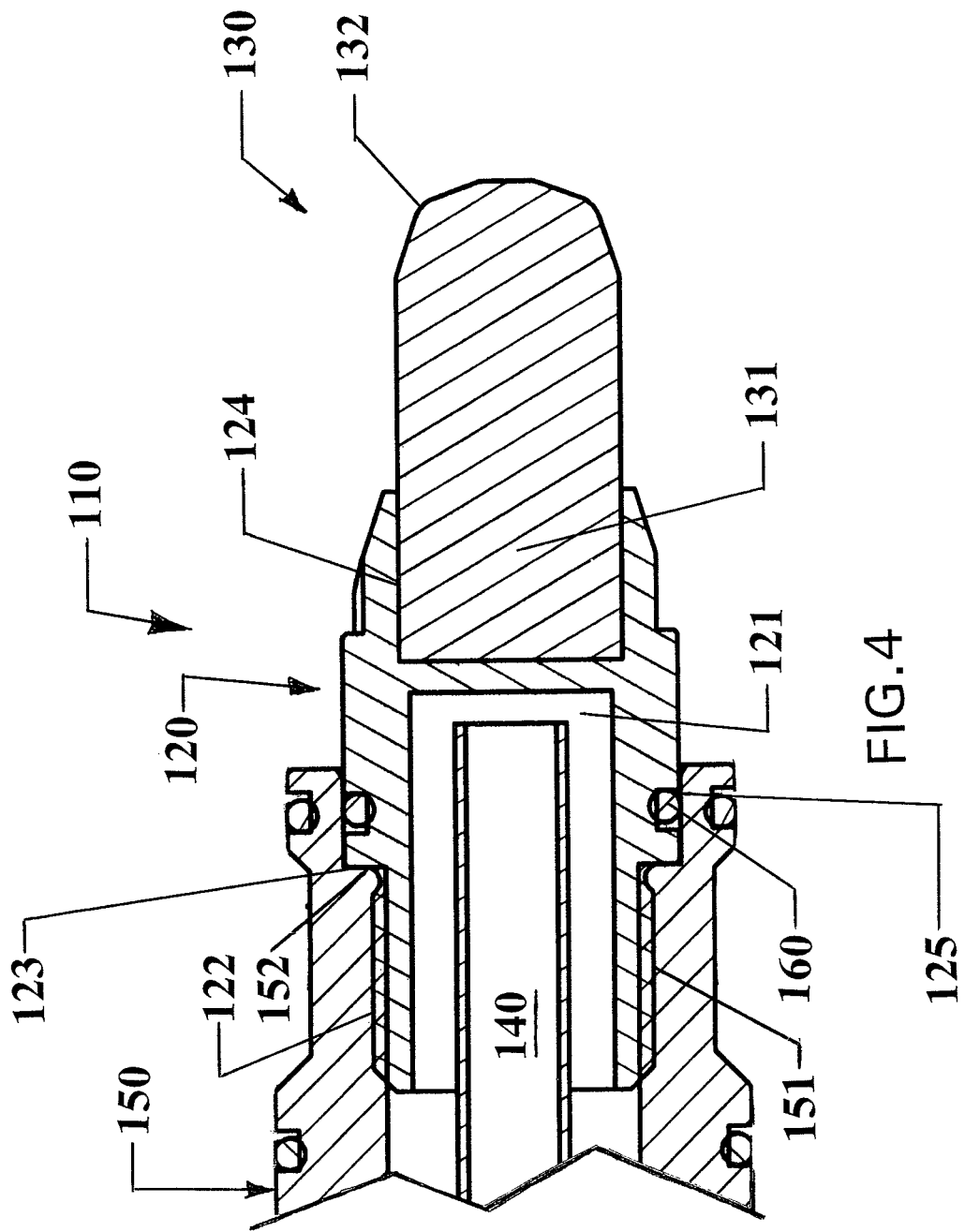
FIG. 4 shows an enlarged portion of FIG. 3.
Figure 5:
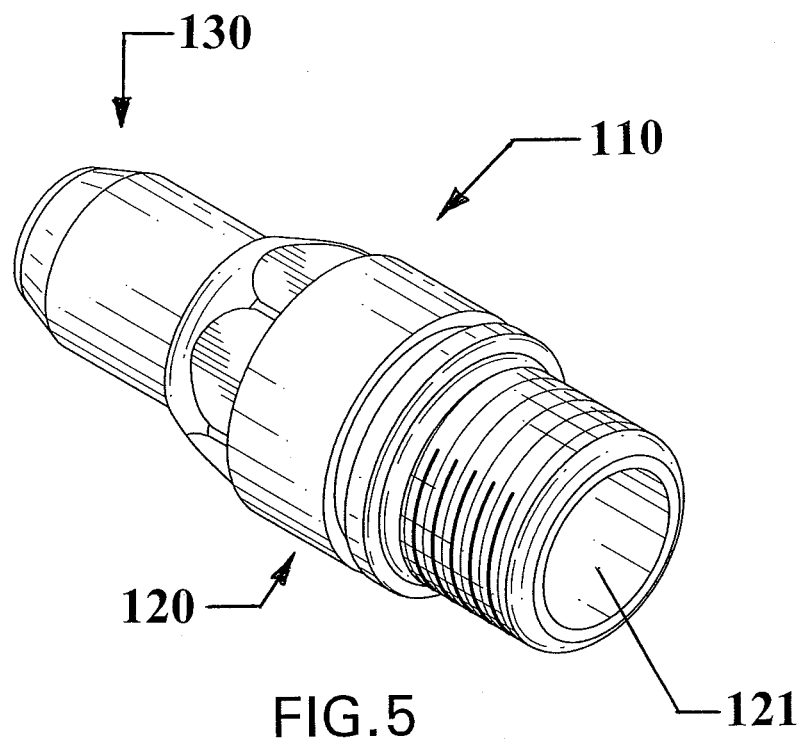
FIGS. 5 and 6 show front and back side perspective views of a cathode in accordance with one non-limiting embodiment of the invention.
Figure 6:
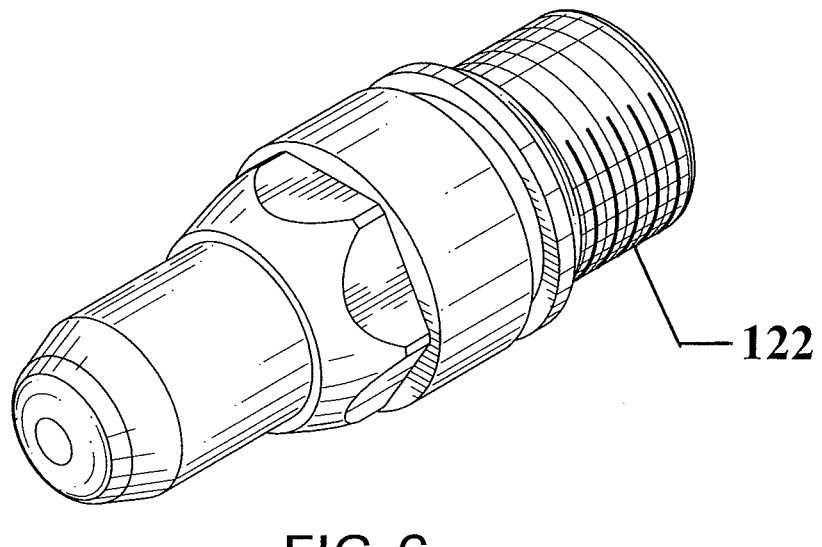

FIGS. 3 and 4 show one non-limiting example of a plasma gun 100 (only the certain main portions of the gun are shown for purposes of illustration) that has an interchangeable and replaceable cathode 110 in accordance with the invention. As can be readily seen when compared to the known arrangement 10/50 shown in FIGS. 1 and 2, the cathode 110 is mechanically and electrically connected to a main portion 150 of the plasma gun 100 via an interface but which lacks any seal, i.e., the interface lacks any non-metallic or non-electrically conductive seal as will be described in detail below. Instead, a seal 160 is axially spaced from this interface.

Thus, in the embodiment of FIGS. 3 and 4, the cathode 110 has a mounting portion 120 and a tip 130 from whose front end 132 a plasma arc discharges in a continuous manner during plasma spraying. The tip 130 has a rear portion 131 that is fixed to and extends into a receiving zone 124 of the mounting portion 120. The mounting portion 120 includes a main internal space 121 which is sized and configured to receive therein cooling fluid and accommodates therein a front portion of a cooling tube 140. Cooling fluid passes through the tube 140 via a main cooling passage 170 of the plasma gun 100. The mounting portion 120 also includes an external thread 122 which threads into comparable internal threads 151 of the component 150 and functions to axially mechanically fix and electrically connect the cathode 110 to a main internal component 150 of the plasma gun 100. However, to provide sealing between the cathode 110 and the component 150 to among other things, prevent cooling fluid (typically pressurized) from escaping from the space 121, a seal or O-ring 160 at a location other than an area of an annular connecting interface formed between the interface coupling surface 123 of the cathode 110 and the interface coupling surface 152 of the internal component 150. In the embodiment of FIGS. 3 and 4, the O-ring 160 is spaced from the interface 123/152 and is instead arranged in a generally circumferential groove 125. The groove 125 can be arranged on the cathode 110 as an outer circumferential groove as shown in FIGS. 3 and 4 or alternatively as an inner circumferential groove arranged on the internal component 150. Owing to its position spaced from the interface 123/152, the O-ring 160 is not subjected to relatively high temperatures as in the prior art. Additionally, its location spaced from the interface is more ideal from the standpoint of providing maximum electrical conductivity between the cathode 110 and the component 150. This is because surfaces of the interface which were previously spaced apart (see FIGS. 1 and 2) and which served to define a space for receiving therein an O-ring or seal can now be brought into electrical contact with one another. As a result of the configuration shown in FIGS. 3 and 4, a standardized interface is provided which offers significant improvement over known connecting interfaces between the components 110 and 150.

Figure 7:
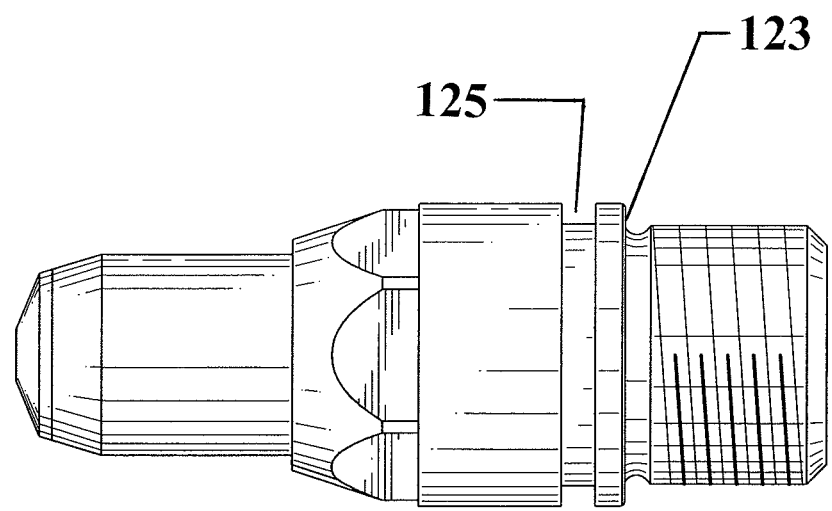
FIGS. 7 and 8 shows side and rear end view of the cathode shown in FIGS. 5 and 6.
Figure 8:
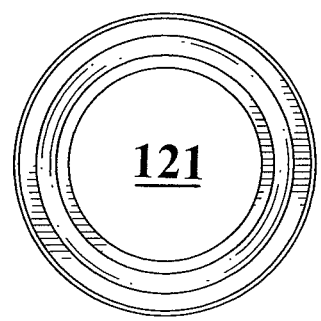

Referring now to FIGS. 5-8, it can be seen that an exemplary cathode 110 has a generally cylindrical mounting portion 120 and a generally cylindrical tip 130 from whose front end 132 a plasma arc discharges in a continuous manner during plasma spraying. The mounting portion 120 includes a generally cylindrical main internal space 121 which is sized and configured to receive therein cooling fluid and accommodates therein a front portion of a cooling tube 140 (see FIG. 4). The mounting portion 120 also includes an external thread 122 arranged on a rear end of the portion 120 as well as hex-shaped portion arranged adjacent the tip 130. The hex-shaped portion is sized and configured so that an operator can remove the cathode 110 using a suitable tool such as a wrench or socket wrench, and, in this way, unthread the external threads 122 from the internal threads 151 of the internal component 150 during cathode 110 removal. The same hex-shaped portion allows an operator to install the cathode 110 using a suitable tool such as a wrench or socket wrench, and, in this way, thread the external threads 122 into the internal threads of the internal component 150 during cathode 110 installation. As can be seen in FIG. 7, a groove 125 can be arranged on the cathode 110 as an outer circumferential groove and this groove 125 is axially spaced from an interface coupling surface 123 of the cathode 110.

In embodiments, the threaded connecting sections 122 and 151 can be of any type and are not limited to, for example, machine threads. Moreover, either the thread 122 or thread 151 need not be completely circumferential and can be in the form of intermittent threads. Non-limiting examples include ⅝-18 UNF thread. The interface 123/152 need not be limited to that shown in FIGS. 3 and 4 and can additionally also function as a stop for the threading on of the cathode 110. In embodiments, the O-ring 160 can be of any type, i.e., generally circular, square or rectangular in cross-section, and preferably functions to provide sealing for the cooling fluid circuit. The materials for certain components such as components 150, 120 and 130 can be the same as those used for comparable component utilized in conventional plasma guns such as that shown in FIGS. 1 and 2.

Figure 9:
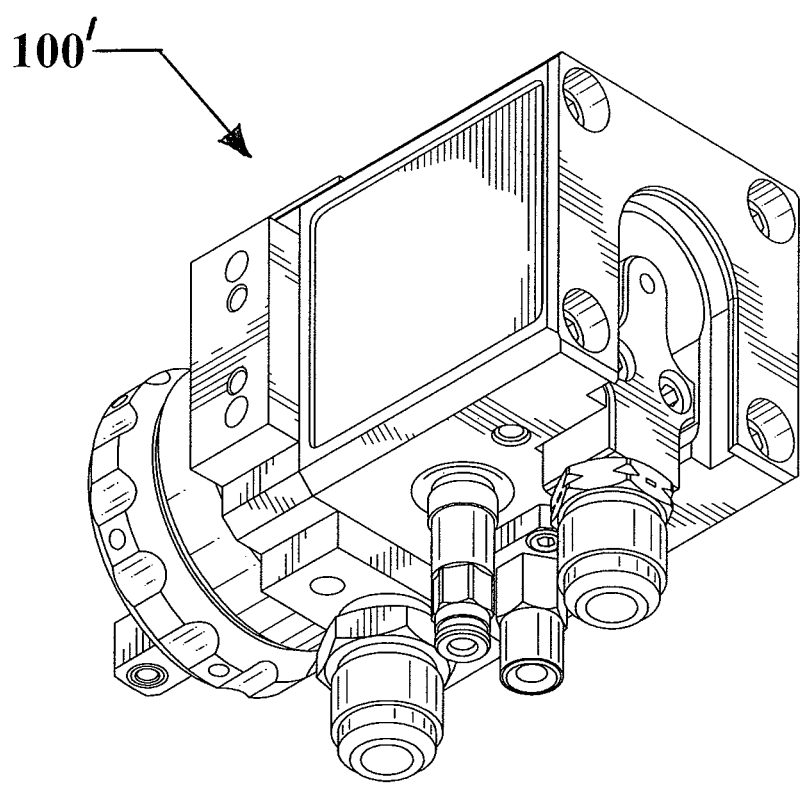
FIGS. 9 and 10 show front and back side perspective views of an exemplary plasma gun utilizing an interchangeable electrode interface in accordance with one non-limiting embodiment of the invention.
Figure 10:
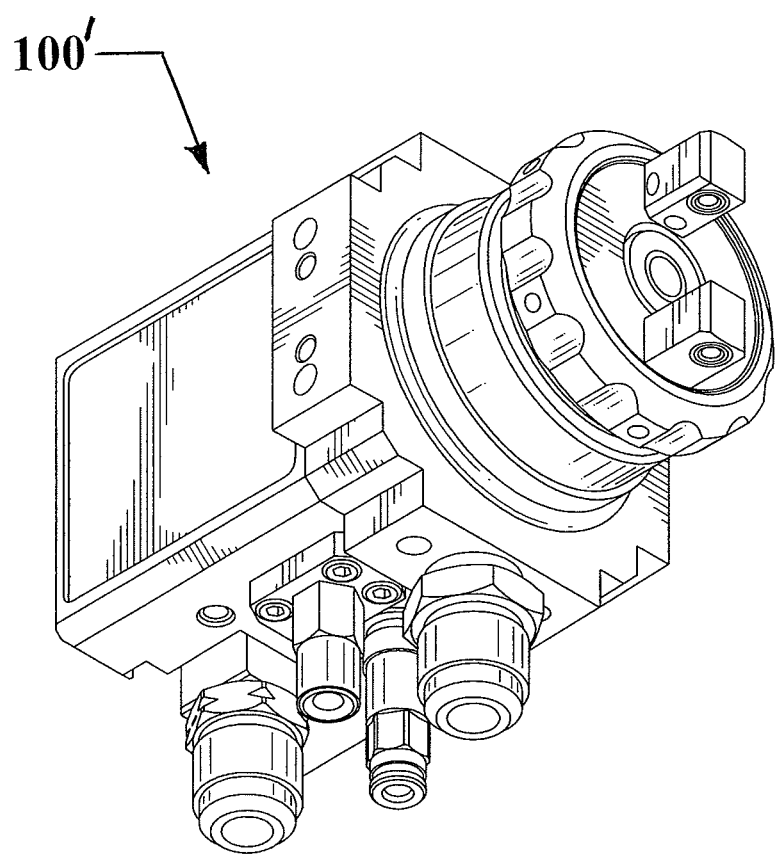
Figure 11:
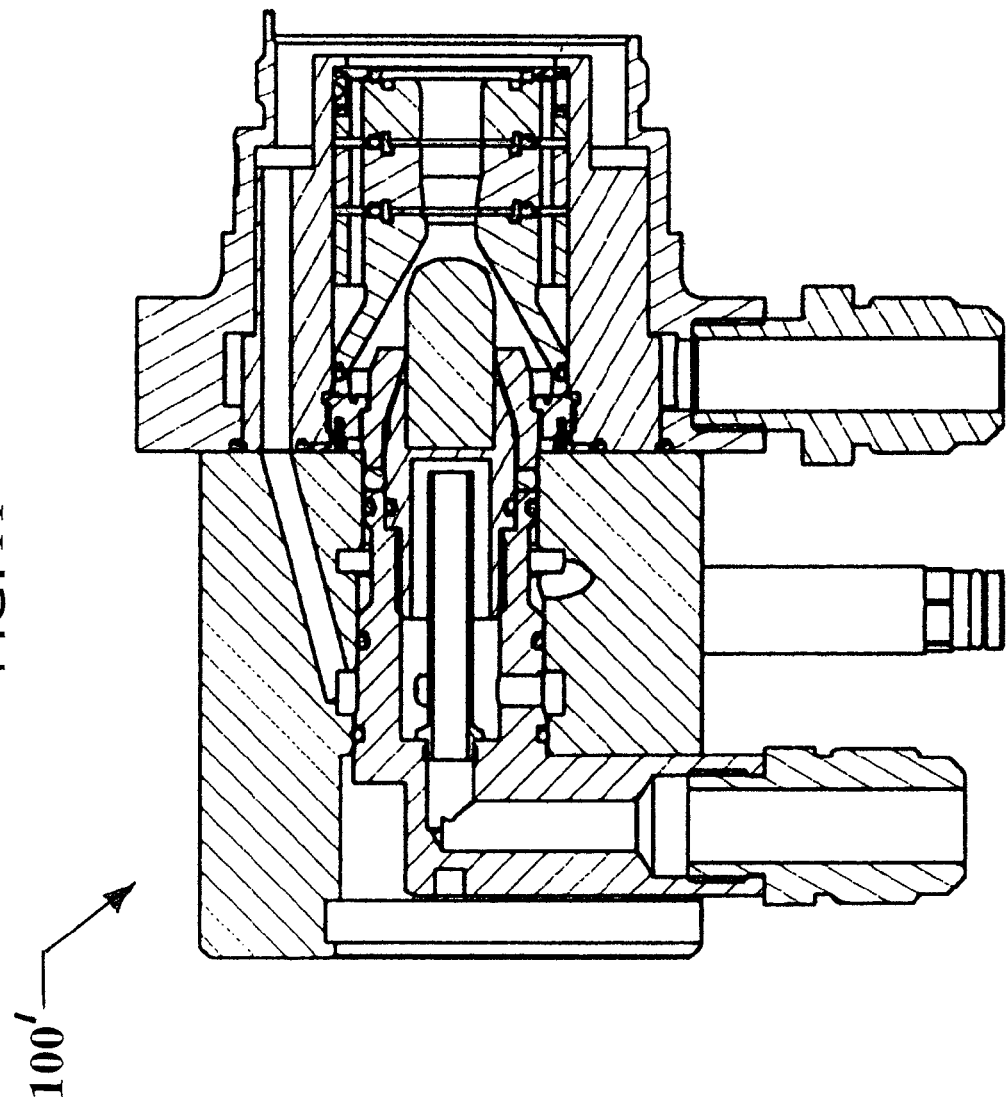
FIG. 11 shows a side cross-section view of the plasma gun shown in FIGS. 9 and 10.

FIGS. 9-11 show one non-limiting plasma gun 100' that can utilize the interchangeable interface shown in FIGS. 3 and 4. Here, a Sulzer Metco SinplexPro-90 Plasma Gun is provided with an interchangeable cathode (see FIG. 11) utilizing the interchangeable interface of the type exemplified in FIGS. 3 and 4.

Figure 12:
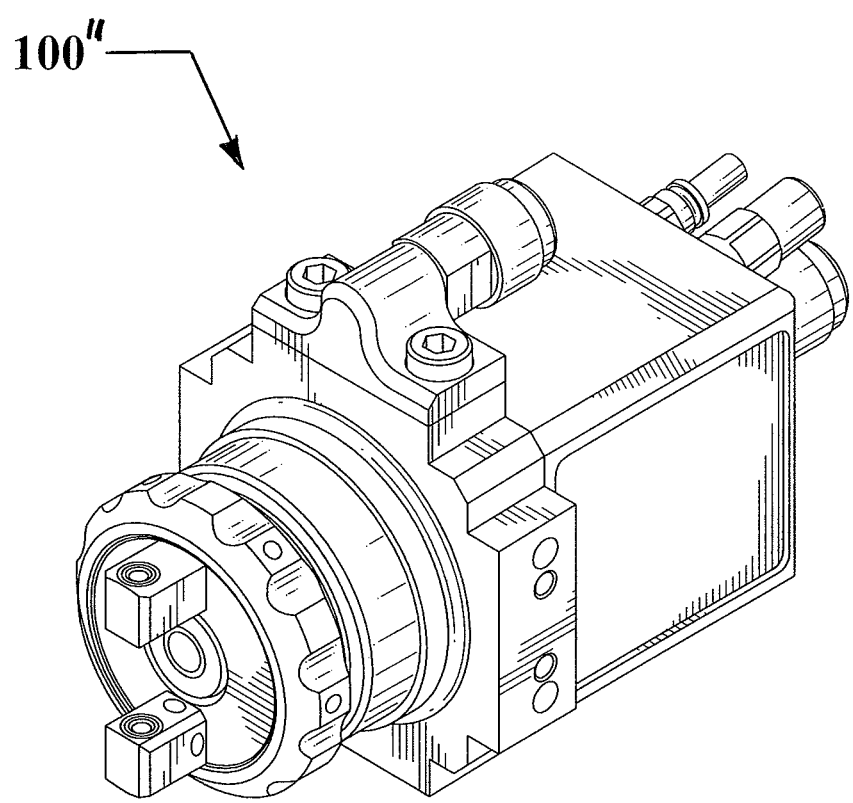
FIGS. 12 and 13 show front and back side perspective views of another exemplary plasma gun utilizing an interchangeable electrode interface in accordance with one non-limiting embodiment of the invention.
Figure 13:
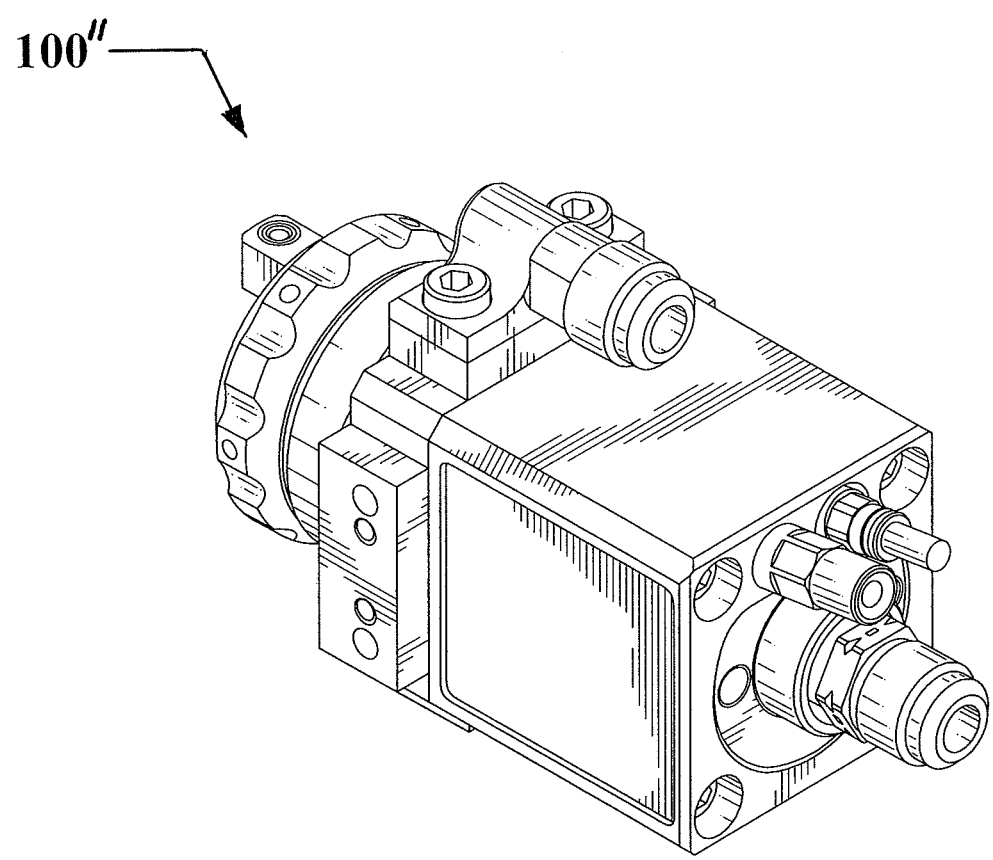
Figure 14:
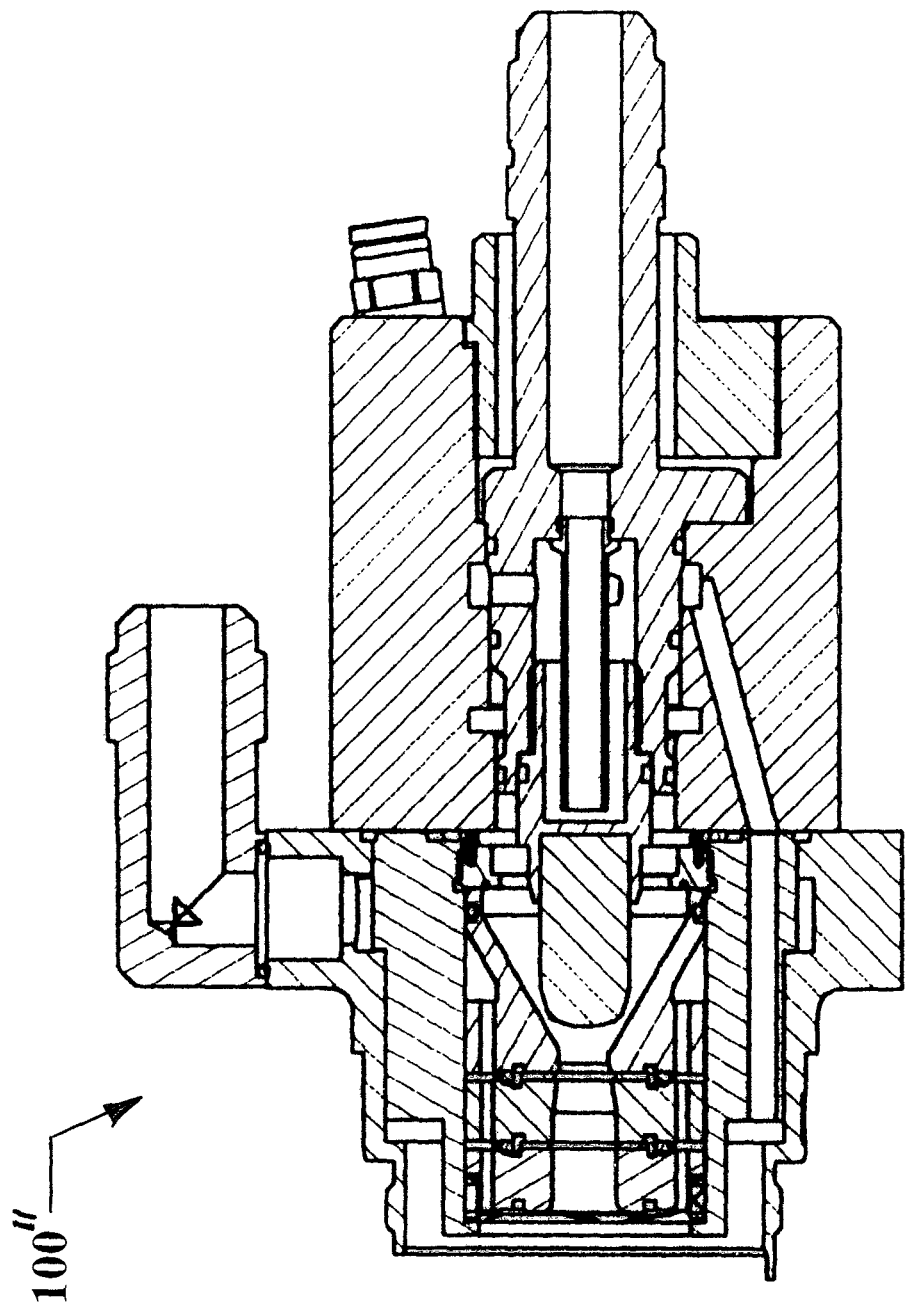
FIG. 14 shows a side cross-section view of the plasma gun shown in FIGS. 12 and 13.

FIGS. 12-14 show another non-limiting plasma gun 100" that can utilize the interchangeable interface shown in FIGS. 3 and 4. Here, a Sulzer Metco SinplexPro-180 Plasma Gun is provided with an interchangeable cathode (see FIG. 14) utilizing the interchangeable interface of the type exemplified in FIGS. 3 and 4.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. An interchangeable electrode interface for a thermal spray plasma gun, comprising:
   an interchangeable electrode comprising:
      an external connecting section;
      an electrical arc discharging end;
      a first annular coupling surface axially disposed between the external connecting section and the electrical arc discharging end;
   an internal connecting section arranged in a plasma gun and comprising a second annular coupling surface; and
   an annular seal axially spaced from the first and second annular coupling surfaces and being axially disposed between the first and second annular coupling surfaces and the electrical arc discharging end,
   wherein the first and second annular coupling surfaces are in electrical contact with one another and the external connecting section is removably connectable to the internal connecting section.

2. The electrode interface of claim 1, wherein the interchangeable electrode is a cathode electrode.

3. The electrode interface of claim 1, wherein the interchangeable electrode is a two-piece electrode that comprises a mounting portion and a different material arc discharge portion.

4. The electrode interface of claim 1, wherein the external connecting section comprises an external thread and the internal connecting section comprises an internal thread.

5. The electrode interface of claim 1, wherein, in an installed condition, the first and second annular coupling surfaces form a main electrical interface without any non-metallic or non-electrically conductive seal interposed therein.

6. The electrode interface of claim 1, wherein the annular seal is an O-ring.

7. The electrode interface of claim 1, wherein the annular seal is at least one of:
   arranged in an outer circumferential groove of the interchangeable electrode; and
   arranged to provide sealing between inner and outer circumferential surfaces.

8. The electrode interface of claim 1, wherein the annular seal is located axially in front of the first and second annular coupling surfaces and is spaced from the first and second annular coupling surfaces by an amount that is less than an axial distance between the first and second annular coupling surfaces and a rear end of the interchangeable electrode.

9. The electrode interface of claim 1, wherein the internal connecting section is arranged at least one of:
   on a main internal component of the plasma gun; and
   on a non-interchangeable internal component of the plasma gun.

10. The electrode interface of claim 1, wherein the interchangeable electrode is a cathode electrode having an internal cooling space.

11. An interchangeable electrode interface for a thermal spray plasma gun, comprising:
    an interchangeable cathode comprising:
       a mounting section having an external thread;
       an electrical arc discharging front end;
       a first annular coupling surface axially disposed between the external thread and the electrical arc discharging front end;
    an internal thread and a second annular coupling surface arranged in a plasma gun; and
    an annular seal axially spaced from the first and second annular coupling surfaces and being axially disposed between the first and second annular coupling surfaces and the electrical arc discharging front end,
    wherein the first and second annular coupling surfaces are in electrical contact with one another when the external threads and the internal threads engage one another.

12. The electrode interface of claim 11, wherein the interchangeable electrode comprises an discharge portion made of a different material that the mounting section.

13. The electrode interface of claim 11, wherein the annular seal is an O-ring.

14. The electrode interface of claim 11, further comprising a circumferential groove arranged in an outer circumferential surface of the interchangeable electrode.

15. The electrode interface of claim 11, wherein the internal thread is arranged on a non-interchangeable internal component of the plasma gun.

16. An interchangeable electrode interface for a thermal spray plasma gun, comprising:
    an interchangeable cathode comprising:
       a mounting section having an external releasable connecting interface;
       an internal coolant receiving space;
       an electrical arc discharging front end;
       a first annular coupling surface axially disposed between the external releasable connecting interface and the electrical arc discharging front end;
    an internal releasable connecting interface and a second annular coupling surface arranged in a plasma gun; and an annular seal in front of and axially spaced from the first and second annular coupling surfaces, and surrounding a portion of the internal coolant receiving space, wherein the first and second annular coupling surfaces are in electrical contact with one another.

17. The electrode interface of claim 16, wherein the interchangeable electrode is a two-piece electrode.

18. The electrode interface of claim 16, wherein the external releasable connecting interface comprises an external thread and the internal releasable connecting interface comprises an internal thread.

19. A method of making a plasma gun comprising:
installing, in the plasma gun, an interchangeable electrode having the interchangeable electrode interface in accordance with claim 1.

20. A method of replacing an interchangeable electrode of a plasma gun comprising:
removing a used interchangeable electrode from the plasma gun; and
installing a new interchangeable electrode having the interchangeable electrode interface in accordance with claim 1.

21. The electrode interface of claim 1, wherein the interchangeable electrode interface is a standard electrode interface.

* * * * *